US008593051B2

(12) United States Patent
Holmes et al.

(10) Patent No.: US 8,593,051 B2
(45) Date of Patent: Nov. 26, 2013

(54) APPARATUS FOR PRODUCING A CHARGED PARTICLE BEAM

(75) Inventors: Timothy Andrew James Holmes, Berkshire (GB); Mervyn Howard Davis, Sussex (GB)

(73) Assignee: Nordiko Technical Services Limited, Havant Hampshire (GB)

( * ) Notice: Subject to any disclaimer, the term of this patent is extended or adjusted under 35 U.S.C. 154(b) by 369 days.

(21) Appl. No.: 12/529,163

(22) PCT Filed: Feb. 21, 2008

(86) PCT No.: PCT/GB2008/050118
§ 371 (c)(1),
(2), (4) Date: Mar. 18, 2010

(87) PCT Pub. No.: WO2008/107705
PCT Pub. Date: Sep. 12, 2008

(65) Prior Publication Data
US 2010/0187970 A1    Jul. 29, 2010

(30) Foreign Application Priority Data

Mar. 2, 2007 (GB) .................................. 0704079.3
Apr. 26, 2007 (GB) .................................. 0708104.5

(51) Int. Cl.
H01J 27/02    (2006.01)
H05B 31/26    (2006.01)
H01T 23/00    (2006.01)

(52) U.S. Cl.
USPC .................. 313/359.1; 313/231.31; 313/230; 315/111; 315/63; 315/230; 250/423 F; 250/396 R

(58) Field of Classification Search
USPC ................. 315/63, 111, 230, 231; 313/359.1, 313/362.1, 231.61, 231.31; 250/492.21, 250/492.2, 492.3, 423 R
See application file for complete search history.

(56) References Cited

U.S. PATENT DOCUMENTS

| 3,660,715 A | * | 5/1972 | Post ........................ 315/111.51 |
| 4,140,943 A | | 2/1979 | Ehlers |
| 5,036,252 A | | 7/1991 | Lob |
| 5,198,718 A | * | 3/1993 | Davis et al. ................ 313/359.1 |
| 5,517,084 A | * | 5/1996 | Leung ...................... 315/111.81 |
| 6,331,713 B1 | * | 12/2001 | Smick et al. .............. 250/497.1 |
| 7,531,819 B2 | * | 5/2009 | DiVergilio et al. ...... 250/492.21 |
| 2007/0114435 A1 | * | 5/2007 | Kwon et al. .............. 250/423 F |
| 2010/0232559 A1 | * | 9/2010 | Takeishi et al. ............... 376/108 |

FOREIGN PATENT DOCUMENTS

| EP | 0282677 | 9/1988 |
| GB | 2148049 | 5/1985 |
| JP | 07230780 | 8/1995 |

OTHER PUBLICATIONS

International Preliminary Report on Patentability and Written Opinion for PCT/GB2008/050118, dated Sep. 8, 2009, 9 pages.

* cited by examiner

Primary Examiner — Vibol Tan
(74) Attorney, Agent, or Firm — Armstrong Teasdale LLP

(57) ABSTRACT

Apparatus for the production of a charged particle beam, comprising: an ion source plasma chamber (104), having a door (106), and an accelerator (102) mounted on the face of the door remote from the ion source plasma chamber.

12 Claims, 5 Drawing Sheets

APPARATUS FOR PRODUCING A CHARGED PARTICLE BEAM

The present invention relates to apparatus for generating a beam of charged particles, i.e. an ion beam. More particularly it relates to an apparatus which is configured to facilitate maintenance.

Ion beams may be produced in ion accelerators. Ion accelerators, which produce broad ion beams beams which can flood relatively large process areas, are now commonplace in advanced thin film manufacturing plants.

Ion beams have been used for used for many years in the production of components in the microelectronics industry and magnetic thin film devices in the storage media industry. In particular, they are used in the production of thin film heads for hard disk drives. It is also anticipated that the technology will become important in the fabrication of semiconductor devices and in the manufacturing processes for magnetic media for use in hard disk drives.

The ion beams can be used in a number of ways to modify the structure of a thin film for example by sputter deposition, sputter etching, milling or surface smoothing. In this context gridded broad ion beam sources are considered more appropriate than non-gridded sources for providing a useable monochromatic ion beam flux.

In the semiconductor, thin film, and materials industries ion implantation is a well known technique used to embed ions into the crystal lattice of materials to modify their electrical properties. Many fabricated micro- and nano-devices rely on the detailed nature of thin film interfaces to enhance efficient operation. Therefore the ability to generate atomically smooth surfaces plays an important role in device and thin film fabrication techniques. The quality of layer interface is important in the fabrication of thin film magnetic sensors used in the storage media industry.

Sputtering applications involve the relatively close proximity of the ion source to a target material. Similarly, milling applications include the relatively close proximity of the ion source to a substrate. These configurations can result in significant material fluxes reaching the ion source and its accelerator and forming a coating. The coating of the accelerator and the passage of material into the body of the source can result in degradation of the accelerator and plasma source performance. Both conducting and non-conducting material coatings can give rise to such material fluxes. It is therefore necessary to put in place periodic maintenance schedules to allow cleaning.

Since any downtime of the apparatus represents a financial loss, it is desirable that the apparatus is configured such that maintenance can be carried out as swiftly as possible. In particular, for industrial applications such as sputtering and milling, access to the ion source and accelerator is provided to facilitate the steps required to maintain them in good working order, and therefore decreases the mean time to repair, that is, the average time required between repairs. This is particularly relevant in industrial apparatus. Simple access and fast dismantling and reassembly are therefore important attributes of the overall design.

In scientific applications it is not uncommon to remove the plasma source to access the accelerator, whereas in industrial use it is more common to have the whole source mounted on an access door. With the door opened the accelerator is exposed and may be removed for maintenance. Where the source cavity requires attention the accelerator must first be demounted to allow access to the source interior.

Ion sources are large and in some cases the weights can be typically between 15 and 50 kg. Design of the apparatus must therefore take this into consideration. It is also necessary to use lifting aids during maintenance and thus the design of the ion source must also take into account the need to allow access for the lifting aids.

It is common to mount the ion source on an access door for industrial applications. Having opened the door there is immediate access to the front (earthed end) of the accelerator. Removal of the accelerator for inspection and maintenance or for access to the source cavity can be cumbersome due the assembly weight. The accelerator is normally fastened directly to the ion source body and part of it assumes the same electrical potential.

The present invention seeks to overcome the problems associated with the prior art and provide a system which allows for ease of access to both the plasma chamber and accelerator and for ease of dismantling and reassembly thereof.

Thus according to a first aspect of the present invention, there is provided an apparatus for the production of a charged particle beam, comprising: an ion source plasma chamber having a door; and an accelerator mounted on a face of the door remote from the ion source plasma chamber.

Thus the arrangement differs from conventional arrangements since the accelerator is not attached directly to the accelerator but to the door holding closing the ion source plasma cavity.

In a preferred arrangement a mount is provided on the face of the door remote from the ion source plasma chamber such that the accelerator is spaced from the door face. In a further preferred arrangement the accelerator is mounted at an earth bonded end to the mount. Most preferably, the accelerator does not touch the walls of the source such that the plasma chamber is free to find its own floating potential.

The door and the first grid of the accelerator are preferably connected via a resistor. This is a safety precaution. The resistor is preferably at 100Ω. The accelerator may be assembled within a frame at earth potential.

The accelerator can be hingeably mounted to said door of the plasma chamber. Where a support frame is present, it may be hinged. This arrangement facilitates access to the interior of the ion source plasma cavity.

The invention is now described, by way of example, with reference to the accompanying drawings, in which.

Figure 1:
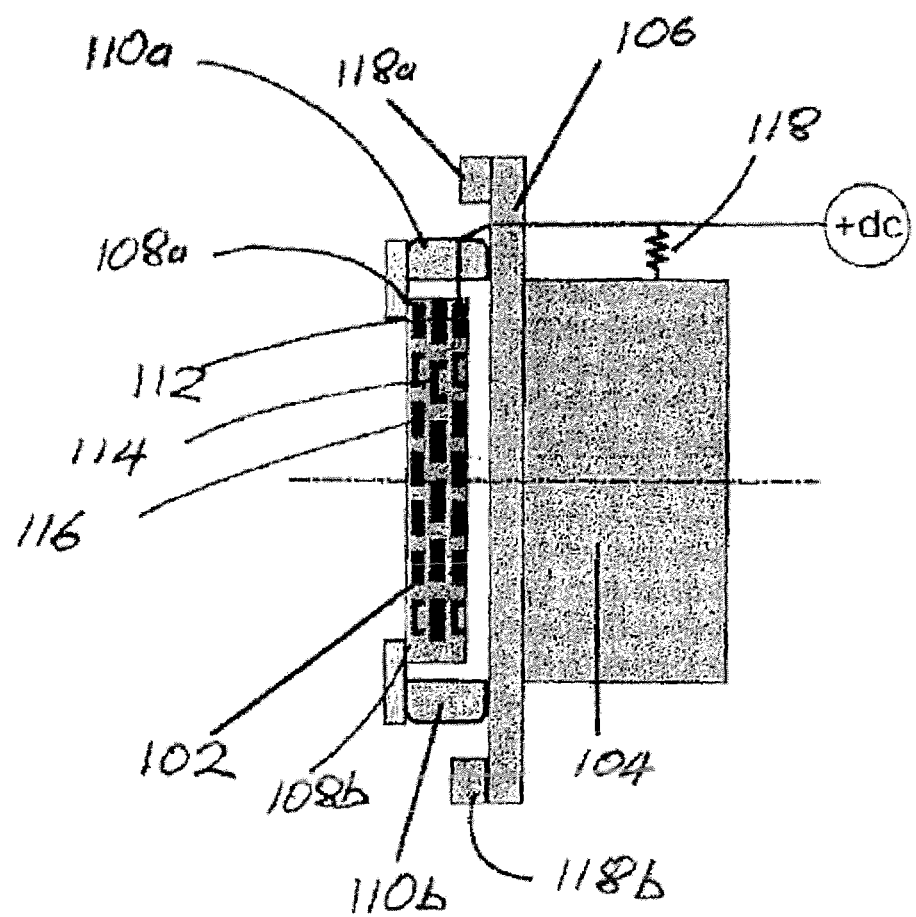
FIG. 1 is a schematic drawing of the apparatus of the present invention.

As illustrated in FIG. 1, an ion source plasma chamber has a door 104 and 106. An accelerator 102 is mounted to, and spaced from the door 106, using accelerator mounts 110a, 110b, which are located in a substantially parallel arrangement to the side of the door 106 remote from the chamber. The accelerator 102 is mounted at earth bonded ends 108a, 108b of the accelerator. One or both accelerator mounts 110a, 110b can be hinged mounts.

The accelerator can be a triode electrode arrangement including a first beam forming electrode 112, a second extraction electrode 114 and a third electrode 116 known as a ground electrode. The ion source can be any appropriate type such as a plasma cavity. However, alternative arrangements of electrodes and ion sources are possible as will be understood by those skilled in the art.

The or each of the electrodes of the accelerator may be of any suitable geometry and may be of the configuration described in co-pending application numbers GB0612915.9 and GB0622788.7 which are incorporated herein by reference.

Thus, the first accelerator electrode 112 is spaced from the door 106 by the accelerator mounts 110*a*, 110*b* so that the first electrode 112 is not in contact with the door 106.

For safety reason the first electrode and the body of the ion source are externally connected via a resistor 118. Typically the resistor will have a resistance of 100Ω.

Figure 2:
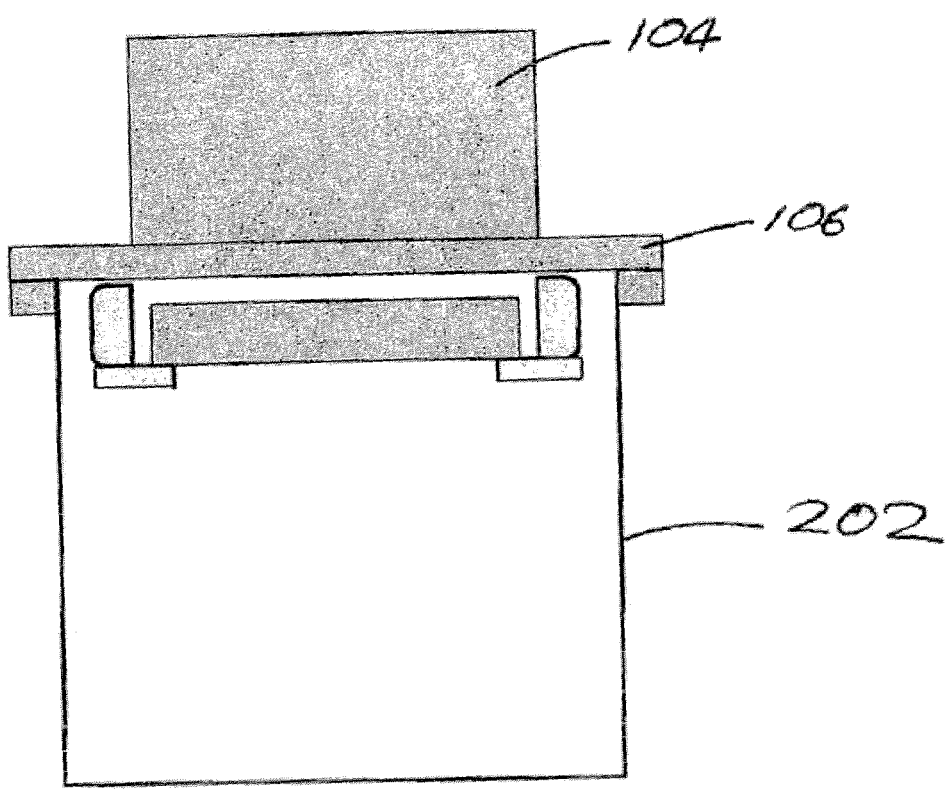
FIG. 2 illustrates the arrangement of FIG. 1 in location.

As shown in FIG. 2, the accelerator 102 is assembled within a reaction chamber 202. The door 106 of the plasma chamber is detachably mounted to the reaction chamber 202 and is arranged to sit in said opening and therefore close the chamber opening. Since the accelerator 102 is mounted to the door 106, rather than directly to the ion source it may be assembled at earth potential. Lifting aids such as handles, not illustrated, may be provided to facilitate movement. Such aids prove useful when the weight of the assembled apparatus exceeds for example 25 Kg. The door 106 can also include flange members 118*a*, 118*b* extending around the periphery thereof which further aid positioning of the door 106 on the frame.

Figure 3:
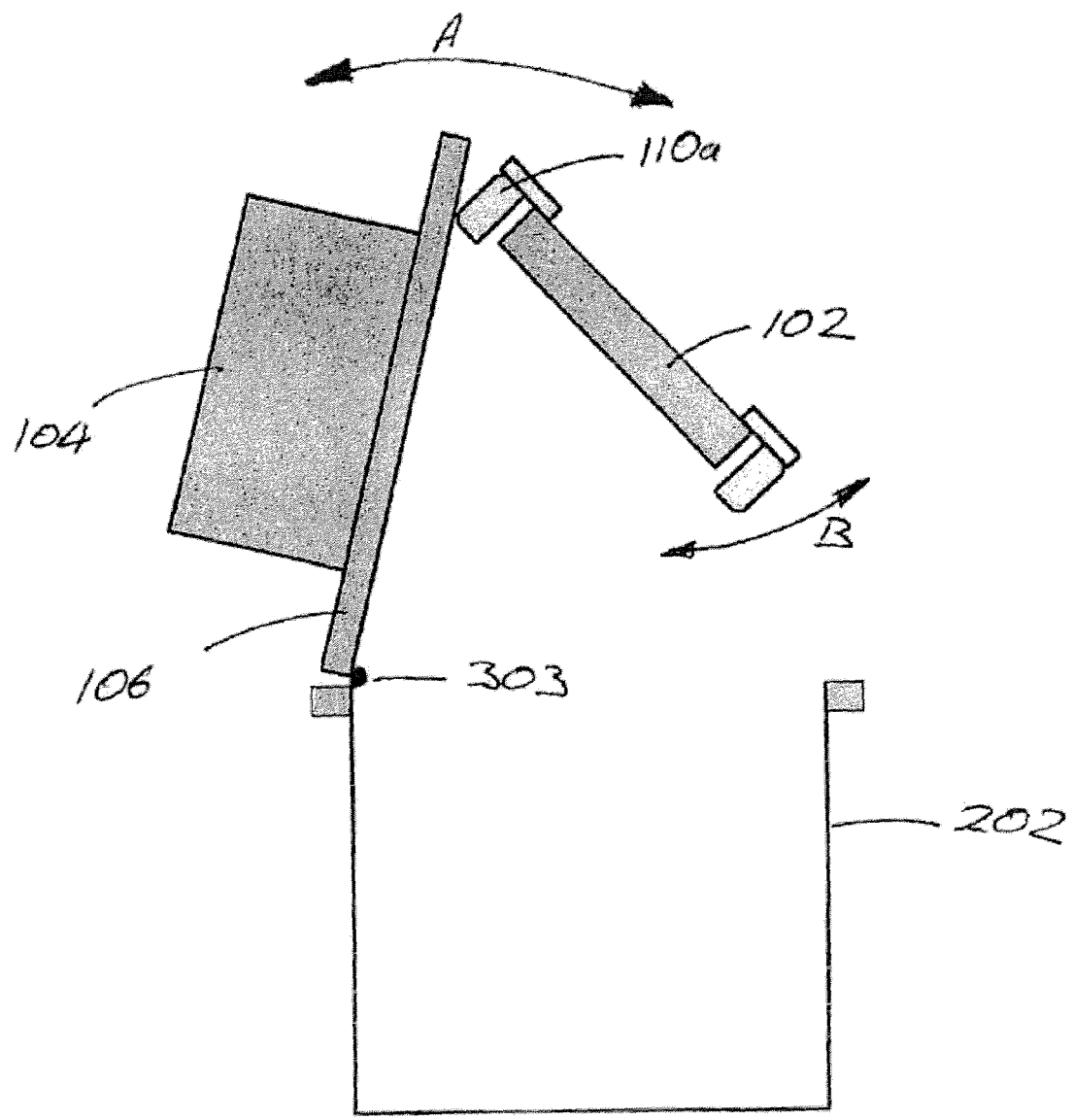
FIG. 3 illustrates the arrangement of FIG. 2 in which the mount and accelerator are shown in hinged positions.

FIG. 3 illustrates the arrangement of the various hinged arrangements, as opened. The door 106 is rotatably mounted to the reaction chamber 202 so that it is free to rotate about a point defined by the junction of the door 106 and chamber 202 in a plane indicated by curved arrow A. Preferably the door 106 is attached to the chamber 202 by a hinge member 303. The hinge member 303 can be arranged such that it also allows for both rotational and translational movement of the mounting member. Additionally, the accelerator 102 is rotatably mounted from the door 106, so that it is free to rotate about a hinged accelerator mount 110*a* as indicated by arrow B. The hinged accelerator mount may also allow for linear translational movement of the accelerator 102.

Figure 4:
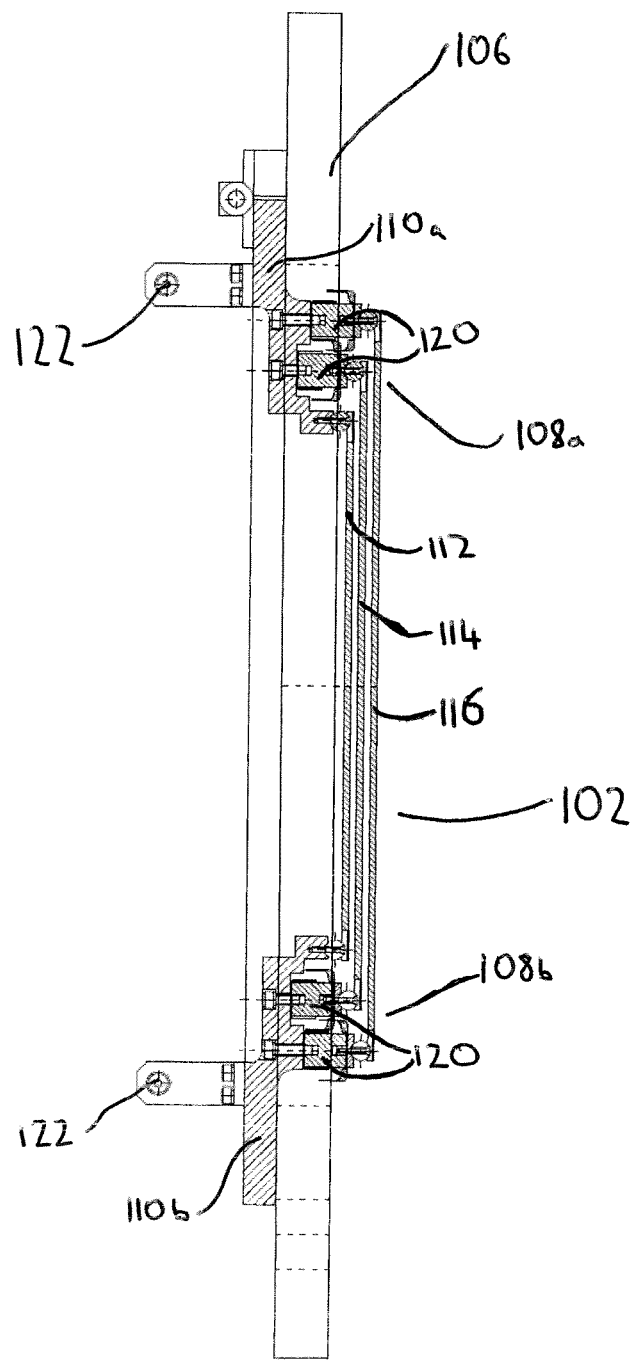
FIG. 4 is a detailed schematic drawing of the door employed in the present invention.

FIG. 4 provides a more detailed schematic view of the apparatus of the present invention. In the illustrated embodiment, the accelerator 102 is a triode electrode arrangement. The first beam forming electrode 112 is mounted directly onto the accelerator mounts 110*a*, 110*b*. The second extraction electrode 114 and third ground electrode 116 are mounted onto the accelerator mounts 110*a* and 110*b* by supplementary accelerator mounts 120. The accelerator also includes contacts 122 for connection to the ion source 104.

Figure 5:
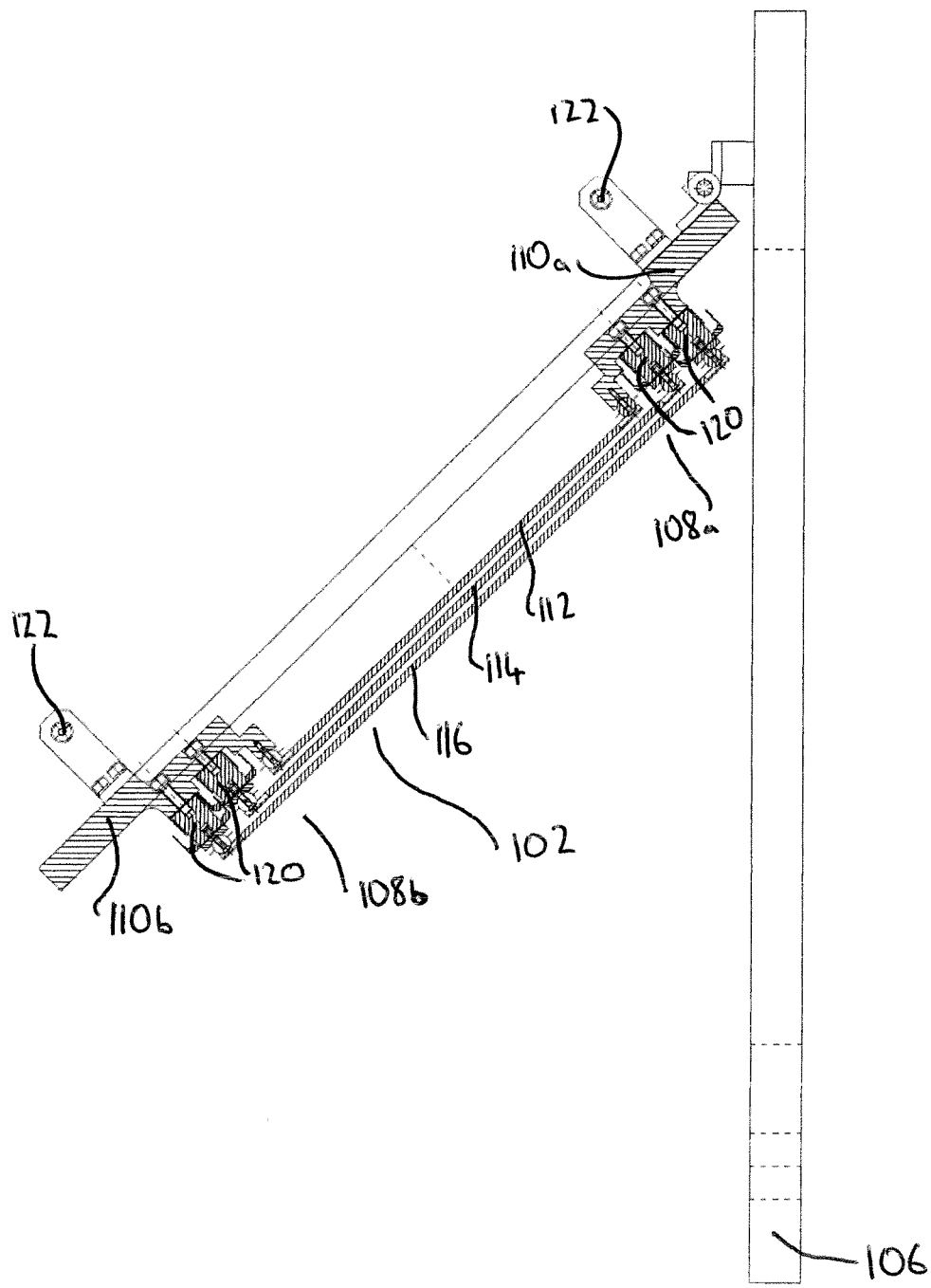
FIG. 5 illustrates the arrangement of FIG. 4 in which the accelerator is shown in a hinged position.

The accelerator mount 110*a* is hingedly mounted onto the door 106 as illustrated in FIG. 5.

The invention claimed is:

1. Apparatus for the production of a charged particle beam, comprising:
    an ion source plasma chamber, having a door moveable between an open position and a closed position, and an accelerator mounted on a face of the door remote from the ion source plasma chamber when the door is in the closed position.

2. Apparatus according to claim 1 wherein the mount is provided on the face of the door remote from the ion source plasma chamber such that the accelerator is spaced from the door face.

3. Apparatus according to claim 2, wherein the accelerator is mounted at an earth bonded end to the mount.

4. Apparatus according to claim 1 wherein the accelerator does not touch the door.

5. Apparatus according to claim 1, wherein said plasma chamber and a first electrode of said accelerator are electrically connected via a resistor.

6. Apparatus according to claim 5 wherein the resistor has a resistance of 100Ω.

7. Apparatus according to claim 1, wherein the accelerator is hinged to the door.

8. Apparatus according to claim 1 wherein the accelerator is mounted in a frame.

9. Apparatus according to claim 8 wherein one or more lifting aids are provided on the frame.

10. Apparatus according to claim 1 wherein the apparatus additionally comprises one or more lifting aids.

11. Apparatus according to claim 9 wherein the one or more lifting aids are handles.

12. Apparatus according to claim 10 wherein the one or more lifting aids are handles.

* * * * *